United States Patent
Sakiyama et al.

(10) Patent No.: US 7,257,801 B2
(45) Date of Patent: Aug. 14, 2007

(54) CELL LIBRARY DATABASE AND TIMING VERIFICATION AND WITHSTAND VOLTAGE VERIFICATION SYSTEMS FOR INTEGRATED CIRCUIT USING THE SAME

(75) Inventors: Shiro Sakiyama, Kyoto (JP); Kouji Mochizuki, Tokyo (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 437 days.

(21) Appl. No.: 10/630,803

(22) Filed: Jul. 31, 2003

(65) Prior Publication Data

US 2004/0040004 A1 Feb. 26, 2004

(30) Foreign Application Priority Data

Aug. 21, 2002 (JP) ............................. 2002-240196

(51) Int. Cl.
  *G06F 17/50* (2006.01)
(52) U.S. Cl. ............................................. 716/17; 716/4
(58) Field of Classification Search ................ 716/17, 716/18, 4–6
  See application file for complete search history.

(56) References Cited

U.S. PATENT DOCUMENTS

| | | | | |
|---|---|---|---|---|
| 5,452,229 A | * | 9/1995 | Shankar et al. ............... | 716/17 |
| 5,880,967 A | * | 3/1999 | Jyu et al. ....................... | 716/6 |
| 5,941,990 A | * | 8/1999 | Hiiragizawa ................. | 713/310 |
| 6,161,213 A | * | 12/2000 | Lofstrom ........................ | 716/4 |
| 6,209,122 B1 | * | 3/2001 | Jyu et al. ....................... | 716/6 |
| 6,551,846 B1 | * | 4/2003 | Furutani et al. .............. | 438/17 |
| 6,671,816 B1 | * | 12/2003 | Woo ............................. | 713/330 |
| 2004/0093531 A1 | * | 5/2004 | Espinor et al. ............. | 713/340 |

FOREIGN PATENT DOCUMENTS

JP    2000-305961    11/2000

\* cited by examiner

*Primary Examiner*—Jack Chiang
*Assistant Examiner*—Binh Tat
(74) *Attorney, Agent, or Firm*—McDermott Will & Emery LLP

(57) ABSTRACT

In a cell library database, timing verification is conducted on an LSI which exists in a variable power supply system capable of changing the source voltage arbitrarily and which includes logic delay information associated with a plurality of source voltages. The database is configured, for example, so that the voltage information V of the source is represented in multiple bits V [1:0] and delay times Alh (Vlh) to Bhl (Vhh) between the time input signals A and B are each changed and the time the output signal Y changes are described for respective pieces of source voltage information LH (1.2 V), HL (1.5 V) and HH (1.8 V). This allows timing verification in the variable source system which operates with the source voltage changed dynamically.

6 Claims, 8 Drawing Sheets

| Vi | (INPUT STATE) | Req1 | Req0 | V[1:0] | (OUTPUT STATE) |
|---|---|---|---|---|---|
| L | (Hi-Z) | don't care | don't care | LL | (Hi-Z) |
| H | (3V) | L | L | LL | (Hi-Z) |
| | | L | H | LH | (1.2V) |
| | | H | L | HL | (1.5V) |
| | | H | H | HH | (1.8V) |

| TRANSITION OF INPUT SIGNAL | | DELAY VALUE (ns) |
|---|---|---|
| Vi | (Req1, Req0) | |
| H | LL→LH<br>LL→HL<br>LL→HH | Vst |
| | LH→LL<br>HL→LL<br>HH→LL | Voff |
| | OTHER THAN THE ABOVE | Vtr |
| L→H | ≠LL | Vist |
| H→L | | Vioff |

| V[1:0] | (OUTPUT STATE) | A | B | Y |
|---|---|---|---|---|
| LL | (Hi-Z) | don't care | don't care | X |
| LH | (1.2V) | L | L | H |
| HL | (1.5V) | L | H | H |
| HH | (1.8V) | H | L | H |
|  |  | H | H | L |

| TRANSITION OF INPUT SIGNALS | | DELAY VALUE FOR EACH STATE OF V[1:0] (ns) | | |
|---|---|---|---|---|
| V[1:0] | (A, B) | LH (1.2V) | HL (1.5V) | HH (1.8V) |
| ≠LL | LH→HH | Alh(Vlh) | Alh(Vhl) | Alh(Vhh) |
|  | HH→LH | Ahl(Vlh) | Ahl(Vhl) | Ahl(Vhh) |
|  | HL→HH | Blh(Vlh) | Blh(Vhl) | Blh(Vhh) |
|  | HH→HL | Bhl(Vlh) | Bhl(Vhl) | Bhl(Vhh) |
| LL→≠LL | XX | Vst(Vlh) | Vst(Vhl) | Vst(Vhh) |
| ≠LL→LL | XX | Voff(Vlh) | Voff(Vhl) | Voff(Vhh) |

| Vi (INPUT STATE) | Req1 | Req0 | V[1:0] (OUTPUT STATE) |
|---|---|---|---|
| L (Hi-Z) | don't care | don't care | LL (Hi-Z) |
| H (3V) | L | L | LL (Hi-Z) |
| | L | H | LH (1.2V) |
| | H | L | HL (1.5V) |
| | H | H | HH (1.8V) |

| TRANSITION OF INPUT SIGNAL | | DELAY VALUE (ns) |
|---|---|---|
| Vi | (Req1, Req0) | |
| H | LL→LH, LL→HL, LL→HH | Vst |
| | LH→LL, HL→LL, HH→LL | Voff |
| | OTHER THAN THE ABOVE | Vtr |
| L→H | ≠LL | Vist |
| H→L | | Vioff |

| Vi (INPUT STATE) | | D1 | D0 | A[1:0] (OUTPUT STATE) | |
|---|---|---|---|---|---|
| L | (Hi-Z) | don't care | don't care | X | (Hi-Z) |
| H | (3V) | L | L | LL | (0.5V) |
| | | L | H | LH | (1V) |
| | | H | L | HL | (1.5V) |
| | | H | H | HH | (2V) |

| TRANSITION OF INPUT SIGNAL | | DELAY VALUE (ns) |
|---|---|---|
| Vi | (D1, D0) | |
| H | ANY CHANGE OF STATE | Atr |
| L→H | ANY STATE | Ast |
| H→L | ANY STATE | Aoff |

| V[1:0] | (OUTPUT STATE) | A | B | Y[2:0] |
|---|---|---|---|---|
| LL | (Hi-Z) | don't care | don't care | XXX |
| LH | (1.2V) | L | L | LHH |
| | | L | H | LHH |
| | | H | L | LHH |
| | | H | H | LHL |
| HL | (1.5V) | L | L | HLH |
| | | L | H | HLH |
| | | H | L | HLH |
| | | H | H | HLL |
| HH | (1.8V) | L | L | HHH |
| | | L | H | HHH |
| | | H | L | HHH |
| | | H | H | HHL |

| V[1:0] | (OUTPUT STATE) | A | B | Y |
|---|---|---|---|---|
| LL | (Hi-Z) | don't care | don't care | X |
| LH | (1.2V) | L | L | H |
| HL | (1.5V) | L | H | H |
| HH | (1.8V) | H | L | H |
|  |  | H | H | L |

| TRANSITION OF INPUT SIGNAL | | DELAY VALUE FOR EACH STATE OF V[1:0] (ns) | | |
|---|---|---|---|---|
| V[1:0] | (A, B) | LH (1.2V) | HL (1.5V) | HH (1.8V) |
| ≠LL | LH→HH | Alh(Vlh) | Alh(Vhl) | Alh(Vhh) |
|  | HH→LH | Ahl(Vlh) | Ahl(Vhl) | Ahl(Vhh) |
|  | HL→HH | Blh(Vlh) | Blh(Vhl) | Blh(Vhh) |
|  | HH→HL | Bhl(Vlh) | Bhl(Vhl) | Bhl(Vhh) |
| LL→≠LL | XX | Vst(Vlh) | Vst(Vhl) | Vst(Vhh) |
| ≠LL→LL | XX | Voff(Vlh) | Voff(Vhl) | Voff(Vhh) |

FIG. 6D    WITHSTAND VOLTAGE: 1.7V

| A | B | Y |
|---|---|---|
| L | L | H |
| L | H | H |
| H | L | H |
| H | H | L |

| A→Y | DELAY VALUE AYns |
|---|---|
| B→Y | DELAY VALUE BYns |

| V | A | B | Y |
|---|---|---|---|
| L | don't care | don't care | X |
| H | L | L | H |
| H | L | H | H |
| H | H | L | H |
| H | H | H | L |

| A→Y | DELAY VALUE AYns |
|---|---|
| B→Y | DELAY VALUE BYns |
| V→Y | DELAY VALUE VYns |

CELL LIBRARY DATABASE AND TIMING VERIFICATION AND WITHSTAND VOLTAGE VERIFICATION SYSTEMS FOR INTEGRATED CIRCUIT USING THE SAME

BACKGROUND OF THE INVENTION

The present invention relates to cell library databases used in computer-aided design (CAD) for logic circuits such as semiconductor integrated circuits and design aiding systems employing this database. Particularly, the present invention relates to cell library databases and timing verification and withstand voltage verification systems of integrated circuits which are appropriate for logical verification, timing verification of delay or the like, failure analysis, and logical verification used in a software development tool.

Generally, computer-aided design (CAD) for a logic circuit such as a semiconductor integrated circuit has conventionally adopted, as a cell library database used for the CAD, a database structure which includes a symbol as shown in FIG. 7A, logical information as shown in FIG. 7B, and logic delay information as shown in FIG. 7C. The symbol shown in FIG. 7A is a logic component indicating a logical product (referred hereinafter to as a NAND gate). FIG. 7B lists logical information on the input-output relation of the NAND gate, and FIG. 7C lists information on logic delay occurring between the change of an input signal and the change of an output signal. Logic design of a semiconductor integrated circuit composed of various types of gates generally conducts logic verification according to the truth table in FIG. 7B and timing verification for checking, with the logic delay information as shown in FIG. 7C, whether the total of logic delays is within a predetermined period of time.

In recent years, a decrease in the threshold voltage of a transistor of a semiconductor integrated circuit accompanied with miniaturization of the circuit, however, has caused a big problem of an increase in leakage current during standby. To solve this problem, a technique for reducing power consumption during standby has conventionally been proposed in which leakage current from the power source is eliminated by stopping power supply during standby. In conducting logical verification on a semiconductor integrated circuit employing this technique in which the power supply is started and stopped, employment of the library database structure in FIG. 7 causes the following problems. First, even when power is not supplied to the circuit, a logic output is produced according to the truth table in FIG. 7B. This prevents a total logical verification including a power control thereof. Second, though the logic delay time between input and output signals at start up of the power source is different from the delay time between input and output signals under normal operation, the database only contains delay time information in the condition in which a steady power is supplied. This prevents an accurate timing verification in consideration of the delay time between the input and output signals at the start up of the power source.

To deal with the foregoing problems, the inventors proposed, in Japanese Unexamined Patent Publication No.2000-305961, a database structure as described below. In this database structure, the database of each cell library contains information on a power source as input information, and logics produced by voltage information of this source and different pieces of input signal information constitute this structure. This structure will now be discussed briefly using FIG. 8. FIG. 8A shows a symbol for a NAND gate. As compared with the symbol of FIG. 7A, that of FIG. 8A has in addition input information V of the source. As shown in FIG. 8B, logical information including source voltage information V is databased so that a source V of L (no-supply) produces an output Y of X (undefined). As compared with the logic delay information of FIG. 7C, that of FIG. 8C has in addition delay times VYns when the source voltage information V is changed. The cell library database proposed by the inventors contains the logical information according to on/off information of the source and information on logic delays of the output Y produced by changing power supplied, so that the database enables logic and timing verifications of the semiconductor integrated circuit using the technique in which the power supply is started and stopped.

Due to the needs for a further reduction in power consumption of a semiconductor integrated circuit, variable power supply techniques have recently been proposed which are intended for the circuit operation with lower power consumption by dynamically changing the source voltage and operation frequency (clock frequency) even when the circuit is in operation.

In conducting logical or timing verification on a semiconductor integrated circuit to which the above technique is applied, the database structure proposed by the inventors causes the following problems. Though logic delay information of a cell library generally varies according to the source voltage value thereof, it only contains, as shown in FIG. 8C, delay information of a single source voltage value and cannot hold the information of the source voltage value in the form of logical information. This prevents timing verification according to a dynamic change in the source voltage value. Moreover, the variable power supply technique described above may supply different source voltages to the circuit, which causes the need for verifying withstand voltage of every cell library.

SUMMARY OF THE INVENTION

The object of the present invention is to provide a cell library database structure which is capable of flexibly handling not only power on/off techniques but also future environments for designing a semiconductor integrated circuit, including variable power supply techniques, and which is capable of conducting, even on a semiconductor integrated circuit to which those techniques are applied, good logical and timing verifications and in addition withstand voltage verification of each element therein.

To attain the foregoing object, in the present invention, information about a voltage value variably given to the same node is added to at least one of a plurality of data terminals included in a basic cell.

Specifically, a cell library database of the present invention, composed of basic circuits of multiple types implementing various logics, is characterized in that the database contains: voltage value information which is given to at least one of a plurality of data terminals composed of input and output terminals included in the basic circuit and in which different voltage states of one node are represented in multiple bits; and logical information between the input and output terminals including one or more said data terminals having the voltage value information.

The present invention is characterized in that in the cell library database, the data terminal having the voltage value information represented in multiple bits is a power source terminal.

The present invention is characterized in that in the cell library database, the data terminal having the voltage value information represented in multiple bits is a digital input terminal or a digital output terminal.

The present invention is characterized in that in the cell library database, the data terminal having the voltage value information represented in multiple bits is an analog input terminal or an analog output terminal.

The present invention is characterized in that the cell library database further contains information on logic delays between the input and output terminals when logic changes occur therebetween.

The present invention is characterized in that in the cell library database, the database further contains withstand voltage information for each of the basic circuits.

A timing verification system for an integrated circuit of the present invention is one for an integrated circuit composed of basic circuits of multiple types implementing various logics, and is characterized by comprising a cell library database which contains, for each of the basic circuits, voltage value information of a power source represented in multiple bits and given to at least one of a plurality of data terminals composed of input and output terminals included in the basic circuit, logical information between the input and output terminals including one or more said data terminals having the voltage value information of the power source, and information on logic delays between the input and output terminals when changes in the logical information occur therebetween. Furthermore, the system is characterized by conducting timing verification by calculating a logic delay based on the information on logic delays according to the voltage value information from the data terminal which has the voltage value information of the power source and is provided in each of the basic circuits constituting the cell library database.

A withstand voltage verification system for an integrated circuit of the present invention is one for an integrated circuit composed of basic circuits of multiple types implementing various logics, and is characterized by comprising a cell library database which contains, for each of the basic circuits, voltage value information in which different voltage states of one node are represented in multiple bits and which is given to at least one of a plurality of data terminals composed of input and output terminals included in the basic circuit, and withstand voltage information of the basic circuit. Furthermore, the system is characterized by conducting withstand voltage verification by comparing the voltage value information from the data terminal having the voltage value information with the withstand voltage information.

The present invention is characterized in that in the withstand voltage verification system for an integrated circuit, the data terminal having the voltage value information represented in multiple bits is a power source terminal.

As is apparent from the above, the cell library database of the present invention provides, for at least one of data terminals, voltage value information in which a voltage condition of one node is represented as multiple bits, and contains logical information between input and output terminals including the data terminal or terminals. This enables logical verification on logical information including voltage value information in a digital design environment.

Particularly, the present invention enables logical verification based on information of a source voltage to be supplied.

Moreover, the present invention enables logical verification on logical information including voltage levels of digital input and output signals.

In the present invention, in addition, an analog input terminal or an analog output terminal is provided with voltage value information in which different voltage states of one node are represented in multiple bits, thereby enabling a total logical verification to which is also subjected an analog interface on circuitry embedded with analog and digital subcircuits.

Furthermore, in the present invention, the cell library database contains information on logic delays between the input and output signals when logic changes occur therebetween, thereby enabling timing verification.

Moreover, in the present invention, the cell library database contains withstand voltage information, thereby enabling withstand voltage verification.

In the timing verification system for an integrated circuit of the present invention, the basic circuits each have logic delay information for each piece of voltage information of the power source. This enables even semiconductor circuit design using a variable power supply technique to conduct a good timing verification when a dynamic change of source voltage is repeated during operation.

The withstand voltage verification system for an integrated circuit of the present invention can compare voltage value information given to the data terminals with withstand voltage information. This makes it possible to conduct withstand voltage verification on input signals to data terminals, one or more output signals from one or more data terminals and source voltages given to a data terminal.

Particularly, the present invention provides information on a source voltage value supplied to a source terminal. This enables semiconductor circuit design using a variable power supply technique to verify withstand voltage on the source voltage of the basic circuit in the case where the source voltage is changed dynamically during operation.

BRIEF DESCRIPTION OF THE DRAWINGS

FIG. 6D shows withstand voltage information of the NAND cell.

FIG. 8 shows a cell library database proposed by the inventers. In FIG. 8.

DETAILED DESCRIPTION OF THE INVENTION

Preferred embodiments of the present invention will be discussed below with reference to the accompanying drawings.

First Embodiment

FIG. 1 shows a cell library database of a first embodiment of the present invention.

Figures 1A, 1B, 1C:
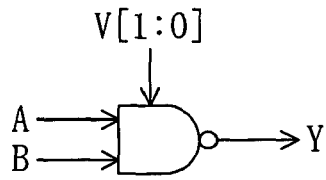
FIG. 1A is a diagram illustrating a symbol for an exemplary basic cell (a NAND cell) according to a first embodiment of the present invention.
FIG. 1B is a truth table of logics of the NAND cell.
FIG. 1C is a table listing information on delays between input and output terminals of the NAND cell when various logic changes occur therebetween.

In FIG. 1, FIG. 1A illustrates a symbol for a cell library of a NAND gate as an exemplary basic circuit. The symbol includes four data terminals A, B, Y and V, of which the data terminals A and B are digital signal input terminals, the data terminal Y is a digital signal output terminal, and the data terminal V is a power source terminal for receiving a source voltage. In the following discussion, input signals to the input terminals A and B, source voltage signals to the power source terminal V, and output signals from the output terminal Y are also marked with the same letters as those indicating the respective terminals. FIG. 1B shows a truth table for logics relative to input signals A and B and a source voltage signal V illustrated in FIG. 1A. FIG. 1C lists various pieces of information on logic delays of the NAND gate occurring between the time the input signals A, B and V are each changed and the time the output signal Y changes.

Figures 2A, 2B, 2C:
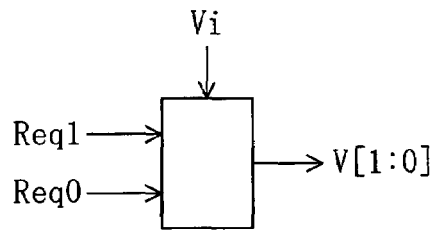
FIG. 2A is a diagram illustrating a symbol for a voltage conversion cell according to a second embodiment of the present invention.
FIG. 2B is a truth table of logics of the voltage conversion cell.
FIG. 2C is a table listing information on delays between input and output terminals of the voltage conversion cell when various logic changes occur therebetween.

The first embodiment is characterized in that the database contains pieces of information on voltage values in which different source voltages supplied to the source terminal V (as one node) (for example, no supply, 1.2 V, 1.5 V, and 1.8 V) are represented by a source voltage signal V [1:0] in multiple bits (two bits in the first embodiment), as shown in FIG. 2B. Note that the multiple-bit representation does not mean the represented terminal has a plurality of signal lines.

FIG. 1B lists logical information between the input terminals A, B and V and the output terminal Y (the source terminal V to which the source voltage signal V [1:0] is supplied is treated as an input terminal). In this figure, a source voltage signal V [1:0] of LL indicates the state in which no source voltage is supplied, that is, a high-impedance input state (Hi-Z state). Likewise, source voltage signals V [1:0] of LH, HL and HH indicate the states in which 1.2 V, 1.5 V, and 1.8 V of source voltages are supplied, respectively.

FIG. 1C lists delay values of an output Y according to input signal changes for each source voltage value represented by the source voltage signal V [1:0]. For example, in the case of a source voltage signal V [1:0] of LH (that is, a source voltage of 1.2 V), when the combination of the input signals A and B is changed from LH to HH, the value of a delay occurring between the time the input signals are changed and the time the output signal Y changes is described as Alh (Vlh). Likewise, in the case of a source voltage signal V [1:0] of HH (that is, a source voltage of 1.8 V), when the combination of the input signals A and B is changed from LH to HH, the value of a delay occurring between the time the input signals are changed and the time the output signal Y changes is described as Alh (Vhh).

As has been discussed, the cell library database in the first embodiment describes the source voltage value by representing the source voltage signal V in multiple bits V [1:0], as shown in FIG. 1C. This makes it possible to describe logic delay values of the output signal Y relative to logical changes between input and output signals for each source voltage value. As shown in FIG. 1C, the database describes delay times Vst (Vlh), Vst (Vhl) and Vst (Vhh) until a logical stabilization of the output signal Y for each source voltage value where the source voltage signal V [1:0] is changed from LL to ≠LL (from Hi-Z state to 1.2 V-, 1.5 V-, or 1.8 V-voltage supply state). In addition, FIG. 1C lists delay times Voff (Vlh), Voff (Vhl) and Voff (Vhh) until the output signal Y for each source voltage value becomes a logical undefinition where the source voltage signal V [1:0] is changed from ≠LL to LL (from 1.2 V-, 1.5 V-, or 1.8 V-voltage supply state to Hi-Z state).

Although a NAND gate is exemplified in FIG. 1, it is needless to say that the foregoing discussion is also applicable to gates other than the NAND gates, such as logic gates including inverters and OR gates, flip-flop circuits, and various types of memories including RAMs and ROMs.

Second Embodiment

Next discussion will be made of a cell library database of a second embodiment of the present invention. The second embodiment exemplarily employs a voltage conversion cell as a basic circuit.

In FIG. 2, FIG. 2A shows a symbol for the voltage conversion cell, which includes four data terminals Req1, Req0, Vi and V. The data terminals Req1 and Req0 are signal input terminals, the data terminal Vi is a power source terminal for receiving a source voltage, and the data terminal V is a voltage output terminal. FIG. 2B shows a truth table of output voltage values V [1:0] relative to the input signals Req1 and Req0 and the source voltage signal Vi illustrated in FIG. 2A. FIG. 2C lists information on logic delays between the input and output terminals of the voltage conversion cell when logic changes occur therebetween, that is, various pieces of information on logic delays occurring between the time the input signals Req1, Req0 and Vi are each changed and the time the output signal V [1:0] becomes stable.

In the logical information shown in FIG. 2B, the voltage output terminal V [1:0] receives voltage value information in which different states of voltage (Hi-Z state, 1.2 V, 1.5 V and 1.8 V) are represented in two bits. According to this logical information, a source voltage signal Vi of L (the Hi-Z state) produces, regardless of logical information of the input signals Req1 and Req0, an output voltage value V [1:0] of LL, that is, an output of the Hi-Z state. On the other hand, a source voltage signal Vi of H (=3 V) produces any one of four output voltage states according to the logical information of the input signals Req1 and Req0. To be more specific, input signals Req1 and Req0 of LL, LH, HL and HH produce output voltage values V [1:0] of LL (Hi-Z state), LH (1.2 V), HL (1.5 V), and HH (1.8 V), respectively.

FIG. 2C lists various delay values of the output voltage value V [1:0] relative to the respective changes of the input signals Req1, Req0 and Vi. As the delay values obtained when the output voltage value V [1:0] of the voltage conversion cell is changed, this figure is provided with five specific delay values Vst, Voff, Vtr, Vist and Vioff as follows.

Vst: the period of time during which the output V [1:0] changes from Hi-Z state to a fixed voltage value with the source Vi supplying a voltage of H (=3 V)

Voff: the period of time during which the output V [1:0] changes from a fixed voltage value to Hi-Z state with the source Vi supplying a voltage of H (=3 V)

Vtr: the period of time during which the output V [1:0] changes from a fixed voltage value to another fixed voltage value with the source Vi supplying a voltage of H (=3 V)

Vist: the period of time during which the output V [1:0] changes from Hi-Z state to a fixed voltage value where the source Vi is changed from a no-input state to an input state Vioff: the period of time during which the output V [1:0] changes from a fixed voltage value to Hi-Z state where the source Vi is changed from an input state to a no-input state A specific description will be made of the delay value Vst, for example, using FIG. 2C. When the combination of the input signals Req1 and Req0 is changed from LL to LH, HL and HH with the source voltage signal Vi kept H, the output V [1:0] also changes from Hi-Z state to 1.2 V, 1.5 V and 1.8 V, respectively. According to FIG. 2, however, all the delay times until these state changes are stabilized, respectively, are equal to the delay value Vst. In this case, the assumption is made that the delay time until the stabilization of the output V [1:0] when the input signals Req1 and Req0 are changed from LL to the other pieces of information are always equal to the delay value Vst. Alternatively, individual delay times may be described in a cell library according to the actual values of the voltage conversion circuit that are fixed by changing its condition. For the sake of simplicity, the other delay values Voff, Vtr, Vist and Vioff are also defined as typical delay values in this figure.

As has been discussed, in the cell library database in the second embodiment, the multiple-bit representation such as the output V [1:0] is made of various voltage states of the same node not only for the source voltage value supplied to the basic circuit shown in FIG. 1 but also for the output signal of the basic circuit. Therefore, this cell library database enables description of the voltage value of the output signal.

Third Embodiment

Figure 3:
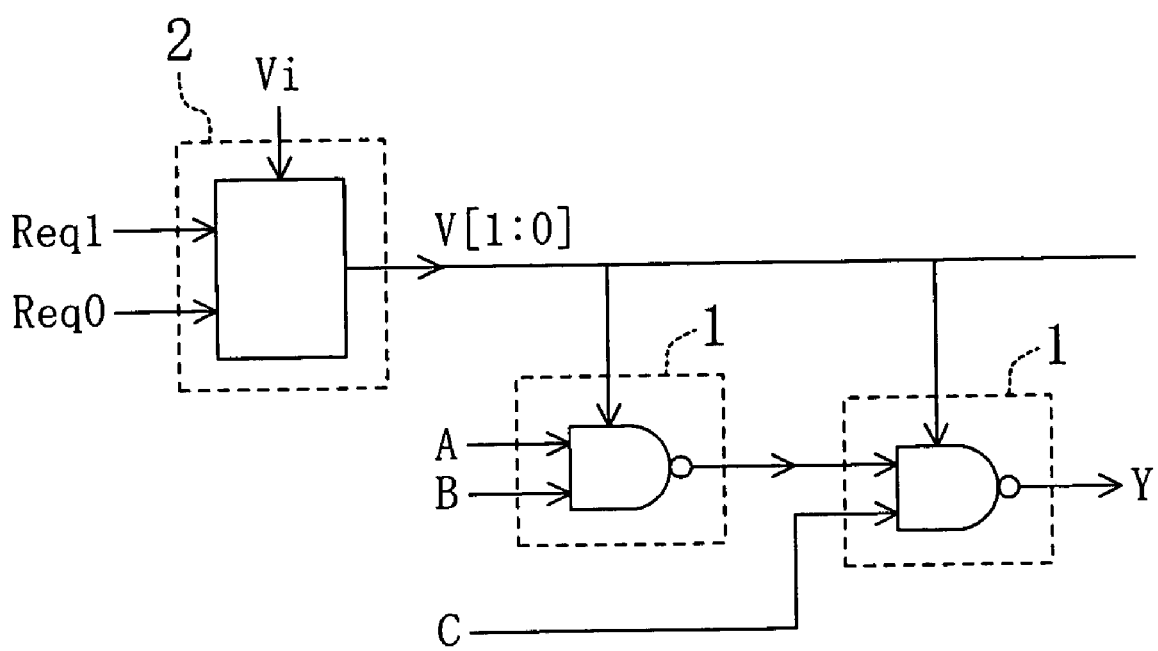
FIG. 3 is a block diagram illustrating a simulation circuit for a variable power supply system using descriptions of cell library operation according to a third embodiment of the present invention.

FIG. 3 shows a timing verification system for an integrated circuit according to a third embodiment of the present invention.

The third embodiment employs the cell library database of the NAND cell shown in FIG. 1 and the cell library database of the voltage conversion cell shown in FIG. 2 to conduct timing verification on LSIs in a variable power supply system capable of varying the source voltage arbitrarily.

FIG. 3 shows an integrated circuit using two NAND gates 1 illustrated in FIG. 1 and a voltage conversion cell 2 illustrated in FIG. 2. This circuit in FIG. 3 is configured to obtain an output signal Y based on pieces of logical information of three input signals A, B and C, in which the output voltage V [1:0] from the voltage conversion cell 2 is supplied to the two NAND gates 1 as a source voltage.

Figures 8A, 8B, 8C:
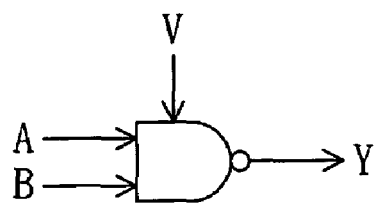
FIG. 8A is a diagram illustrating a symbol for a NAND cell.
FIG. 8B is a truth table of logics of the NAND cell.
FIG. 8C is a table listing information on delays between input and output terminals of the NAND cell when various logic changes occur therebetween.

As can be seen from the cell library database of the NAND cell shown in FIG. 1, in the third embodiment, each NAND cell 1 can obtain source voltage value information of the output V [1:0] from the voltage conversion cell 2. Thus, not only timing verification can be conducted at a predetermined source voltage, such as the verification based on the conventional cell library database shown in FIG. 8, but also the verification can be conducted according to different source voltage values of 1.2 V, 1.5 V and 1.8 V supplied from the voltage conversion cell 2. Moreover, the voltage conversion cell 2 can simultaneously simulate a delay time during a state change of the output voltage V [1:0] using logical information of the input signals Req1 and Req0. Accordingly, the third embodiment enables timing verification of an LSI in a variable power supply system capable of operating with the source voltage changed arbitrarily.

Fourth Embodiment

Next discussion will be made of a fourth embodiment of the present invention.

FIG. 4 shows a cell library database of a digital-to-analog (D/A) conversion cell as a basic circuit. D/A converters are circuitry having the function of transforming multiple digital input signals into an analog voltage output signal. FIG. 4 exemplifies descriptions of the cell operation in the case where two-bit digital input signals D1 and D0 produces an analog voltage output signal A [1:0].

Figures 4A, 4B, 4C:
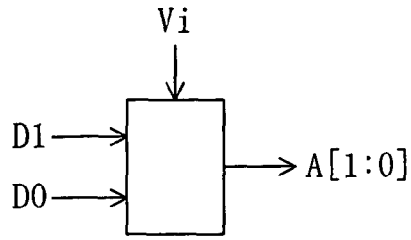
FIG. 4A is a diagram illustrating a symbol for a digital-to-analog (D/A) conversion cell according to a fourth embodiment of the present invention.
FIG. 4B is a truth table of logics of the D/A conversion cell.
FIG. 4C is a table listing information on delays between input and output terminals of the D/A conversion cell when various logic changes occur therebetween.

FIG. 4A shows a symbol for the D/A conversion cell, which includes four data terminals D1, D0, Vi and A. The data terminals D1 and D0 are digital input terminals, the data terminal Vi is a source terminal, and the data terminal A is an analog output terminal. FIG. 4B lists logical information of the D/A conversion cell illustrated in FIG. 4A. FIG. 4C lists various pieces of information on logic delay during the change of the analog output signal A [1:0] according to the respective changes of the input signals D1, D0 and Vi (the source voltage signal is treated as an input signal).

As shown in FIG. 4B, the analog output terminal A has voltage value information in which different voltage output states (Hi-Z state, 0.5 V, 1 V, 1.5 V and 2 V) of the output terminal A (the same node) are represented in two bits. For example, a source voltage signal Vi of H (=3 V) and the combinations of input signals D1 and D0 of LL produce an analog output voltage A [1:0] of LL, that is, 0.5 V. Likewise, the combination of input signals D1 and D0 of LH, HL, and HH produce analog output voltages A [1:0] of LH, HL, and HH, that is, 1 V, 1.5 V, and 2 V, respectively. On the other hand, a source voltage signal Vi of L (Hi-Z state) produces an analog output voltage A [1:0] logically described as X that indicates undefined, regardless of the input signals D1 and D0.

As shown in FIG. 4C, the fourth embodiment is provided, as information on logic delays of the analog output voltage A [1:0] according to logical changes of the input signals Vi, D1 and D0, with three delay values Atr, Ast and Aoff as follows.

Atr: the period of time until the analog output voltage A [1:0] becomes stabilized after the input signals D1 and D0 are changed with power supplied to the cell Ast: the period of time until the analog output voltage A [1:0] becomes stabilized after power is supplied to the cell that power has not been supplied with Aoff: the period of time until the analog output voltage A [1:0] becomes undefined after power supply is stopped which has been conducted on the cell As has been discussed, the cell library database of the D/A conversion cell according to the fourth embodiment is configured to describe even the analog output voltage of the analog output signal in multiple bits. Therefore, use of this database enables timing verification in a digital simulation environment even on a D/A converter that has conventionally had difficulty in executing a logical description and timing description.

Note that the fourth embodiment employs a D/A conversion cell as an example. For an AD conversion cell or the like whose input signal is an analog signal, the input signal is represented in multiple bits to hold voltage value information in this signal. This enables timing verification in a digital simulation environment.

Thus, the fourth embodiment allows logical and timing verifications of a system embedded with various types of analog circuits and digital circuits in a digital simulation environment.

Fifth Embodiment

Next discussion will be made of a fifth embodiment of the present invention using FIG. 5. This embodiment illustrates an example in which a digital output signal from a NAND cell as a basic circuit is also represented in multiple bits.

A digital output voltage value of a CMOS circuit is typically equal to a source voltage value thereof. Therefore, when the digital output signal is represented in multiple bits, it is desirable that the voltage value of input power be provided by representing the input power source voltage as well in multiple bits.

Figures 5A, 5B:
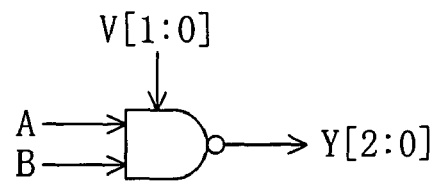
FIG. 5A is a diagram illustrating a symbol for a NAND cell according to a fifth embodiment of the present invention.
FIG. 5B is a table listing information on voltage values of the NAND cell, in which a digital output signal of the cell is represented in three bits.

FIG. 5A shows a symbol for the NAND cell, which receives signals A and B and a source voltage signal V [1:0]. In FIG. 5B, a digital output signal Y of the NAND cell is voltage value information represented in three bits like Y [2:0]. In this information of three-bit representation, the highest two bits hold the same information as the source voltage signal V [1:0] and the lowest one bit holds usual logical information. For example, in the case of a source voltage signal V [1:0] of HH (voltage value=1.8 V), the digital output signal Y [2:0] when the combination of the input signals A and B is HL is represented by HHH. With this representation, it can be seen clearly from the highest two bits of the digital output signal Y [2:0] that the source voltage value is 1.8 V, and it can also be seen from the lowest one bit that the output logic is H.

Note that in the fifth embodiment, the voltage value of a single output signal Y is represented in multiple bits. Alternatively, two or more output signals, one or more digital or analog input signals, or two or more source voltage signals can also be represented in multiple bits at the same time to describe the cell library database.

In the embodiments discussed above, for the sake of simplicity, there are four types of voltage value information of the source voltage signal V [1:0] represented in two bits. It is needless to say that this information can be represented in three or more bits according to the number of voltage values to be employed.

If an input signal is represented in multiple bits to hold voltage value information therein, withstand voltage verification can be conducted based on the voltage value held by the input signal. Such an example will be described below.

Sixth Embodiment

FIG. 6 shows main parts of a withstand voltage verification system of a sixth embodiment of the present invention.

Figures 6A, 6B, 6C:
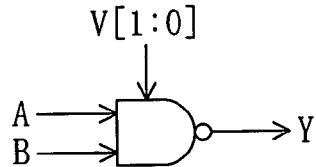
FIG. 6A is a diagram illustrating a symbol for a NAND cell capable of verifying a withstand voltage according to a sixth embodiment of the present invention.
FIG. 6B is a truth table of logics of the NAND cell.
FIG. 6C is a table listing information on delays between input and output terminals of the NAND cell when various logic changes occur therebetween.
Figures 7A, 7B, 7C:
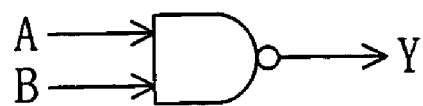
FIG. 7A is a diagram illustrating a symbol for a NAND cell used in a conventional computer-aided design system for logic circuits.
FIG. 7B is a truth table of logics of the NAND cell.
FIG. 7C is a table listing information on delays between input and output terminals of the NAND cell when various logic changes occur therebetween.

FIG. 6 exemplifies a cell library having the function identical to the NAND cell shown in FIG. 1 out of a plurality of basic circuits. A symbol, logical information and logic delay information shown in FIGS. 6A to 6C, respectively, are identical to those in FIGS. 1A to 1C. In FIG. 6, withstand voltage information of the NAND cell is newly added as shown in FIG. 6D. This information refers to the maximum source voltage acceptable to this cell. The system discussed in the sixth embodiment represents the voltage value V [1:0] of input power in multiple bits, so that the system can verify the withstand voltage of the cell easily.

For example, as shown in FIG. 6B, when the source voltages V [1:0] are LH, HL and HH, source voltages of 1.2 V, 1.5 V and 1.8 V are respectively supplied. Therefore, the system is set so that in the case where the withstand voltage of the NAND cell is 1.7 V as shown in FIG. 6D, an error signal is returned or an output indicating the logical undefinition (X) is produced. This setting makes it possible to immediately check withstand-voltage abnormality during logical simulation or timing simulation.

Note that the sixth embodiment illustrates an example in which the source voltage signal V [1:0] contains voltage information. In addition, the input signals A and B can also be represented in multiple bits to hold voltage information. In this case, voltage values of the input signals A and B can also be subjected to withstand voltage verification during the withstand voltage verification of this cell.

What is claimed is:

1. A cell library database composed of basic circuits of multiple types implementing various logics, and stored in a computer readable medium to be used with a computer-aided logic circuit design system in designing an integrated circuit, the database containing on a basic circuit to basic circuit basis:
    voltage value information associated with at least one of a plurality of data terminals composed of input and output terminals included in the basic circuit, the voltage value information including various voltage states to be applied to the at least one of the plurality of data terminals and being represented in multiple bits; and
    logical information between the input and output terminals including one or more said data terminals having the voltage value information, in order to allow the design system to conduct verification of an integrated circuit in consideration of voltage variation of a terminal of each basic circuit in the integrated circuit.

2. The database of claim 1, wherein the data terminal having the voltage value information represented in multiple bits is a power source terminal.

3. The database of claim 1, wherein the data terminal having the voltage value information represented in multiple bits is a digital input terminal or a digital output terminal.

4. The database of claim 1, wherein the data terminal having the voltage value information represented in multiple bits is an analog input terminal or an analog output terminal.

5. The database of claim 1, wherein the database further contains information on logic delays between the input and output terminals when logic changes occur therebetween.

6. The database of claim 1, wherein the database further contains withstand voltage information for each of the basic circuits.

* * * * *